United States Patent
Fidalgo et al.

(10) Patent No.: US 9,980,404 B2
(45) Date of Patent: May 22, 2018

(54) METHOD FOR CREATING A MULTIFUNCTIONAL MODULE AND DEVICE INCLUDING SAME

(75) Inventors: Jean-Christophe Fidalgo, Gemenos (FR); Joseph Leibenguth, Saint-Cloud (FR)

(73) Assignee: GEMALTO SA, Meudon (FR)

( * ) Notice: Subject to any disclaimer, the term of this patent is extended or adjusted under 35 U.S.C. 154(b) by 182 days.

(21) Appl. No.: 13/699,842

(22) PCT Filed: May 24, 2011

(86) PCT No.: PCT/EP2011/058497
§ 371 (c)(1),
(2), (4) Date: Feb. 26, 2013

(87) PCT Pub. No.: WO2011/147843
PCT Pub. Date: Dec. 1, 2011

(65) Prior Publication Data
US 2013/0148309 A1    Jun. 13, 2013

(30) Foreign Application Priority Data
May 27, 2010    (EP) ..................... 10305560

(51) Int. Cl.
*H05K 7/02*    (2006.01)
*G06K 19/07*   (2006.01)
(Continued)

(52) U.S. Cl.
CPC .......... *H05K 7/02* (2013.01); *G06K 19/0718* (2013.01); *G06K 19/07703* (2013.01);
(Continued)

(58) Field of Classification Search
CPC .......... G06K 19/077; G06K 19/07743; G06K 19/07745
(Continued)

(56) References Cited

U.S. PATENT DOCUMENTS 3,723,635 A * 3/1973 Smith .................... H05K 1/118
                                                174/254
5,412,538 A    5/1995 Kikinis et al.
(Continued)

FOREIGN PATENT DOCUMENTS

EP    0913268 A1 *  5/1998  ............. G06K 19/07
EP    1411467 A1    4/2004
(Continued)

OTHER PUBLICATIONS

International Search Report (PCT/ISA/210) dated Jul. 21, 2011, by the European Patent Office as the International Searching Authority for International Application No. PCT/EP2011/058497.
(Continued)

*Primary Examiner* — Dion R Ferguson
*Assistant Examiner* — Mandeep S Buttar
(74) *Attorney, Agent, or Firm* — Buchanan Ingersoll & Rooney PC

(57) ABSTRACT

The invention relates to a method for creating a multi-component device, including the following steps, creating a module having a multilayer structure comprising electrical/electronic components arranged on at least one substrate in stacked layers, the components each having a main surface exposed to the outside, wherein the components are arranged such that the respective main surfaces thereof are oriented in mutually opposite directions. The invention also relates to the corresponding device.

10 Claims, 1 Drawing Sheet

(51) Int. Cl.
*G06K 19/077* (2006.01)
*H05K 13/00* (2006.01)

(52) U.S. Cl.
CPC . *G06K 19/07745* (2013.01); *G06K 19/07747* (2013.01); *G06K 19/07769* (2013.01); *H05K 13/00* (2013.01); *H01L 2224/48091* (2013.01); *H01L 2924/12044* (2013.01); *Y10T 29/49002* (2015.01)

(58) Field of Classification Search
USPC .......................... 361/728, 730; 174/260, 259
See application file for complete search history.

(56) References Cited

U.S. PATENT DOCUMENTS

| | | | | |
|---|---|---|---|---|
| 5,590,038 A | * | 12/1996 | Pitroda | G06Q 20/02 235/380 |
| 5,734,154 A | * | 3/1998 | Jachimowicz | G06K 19/07703 235/454 |
| 6,019,284 A | * | 2/2000 | Freeman | G02F 1/13452 235/375 |
| 6,259,035 B1 | * | 7/2001 | Truggelmann et al. | 174/250 |
| 7,090,139 B2 | * | 8/2006 | Kasuga | G06K 19/0718 235/380 |
| 7,407,390 B1 | * | 8/2008 | Ni | G06K 19/07732 361/752 |
| 7,515,431 B1 | * | 4/2009 | Zadesky | H04M 1/0202 361/616 |
| 8,913,394 B2 | * | 12/2014 | Weber | G06F 1/186 361/728 |
| 2004/0178279 A1 | | 9/2004 | Gundlach | |
| 2006/0057866 A1 | | 3/2006 | Mirsky et al. | |
| 2006/0124350 A1 | | 6/2006 | Droz | |

FOREIGN PATENT DOCUMENTS

| | | |
|---|---|---|
| JP | 2002-366059 A | 12/2002 |
| KR | 10-2005-0085051 A | 8/2005 |
| WO | WO 03/017195 A1 | 2/2003 |
| WO | 2009/078214 A1 | 6/2009 |

OTHER PUBLICATIONS

Written Opinion (PCT/ISA/237) dated Jul. 21, 2011, by the European Patent Office as the International Searching Authority for International Application No. PCT/EP2011/058497.

* cited by examiner

METHOD FOR CREATING A MULTIFUNCTIONAL MODULE AND DEVICE INCLUDING SAME

The invention relates to a method for creating a multifunctional module and a device including same.

The invention relates to the manufacturing of smart objects of the multi-component type in all forms, such as for instance integrated circuit cards, passports and shallow electronic inserts.

The invention more particularly relates, according to a preferred embodiment, to a module having an integrated display and the device including same.

It aims at enabling an economic and simple manufacturing of multi-component objects which preferably have good mechanical resistance properties, more particularly as regards flexion.

Current multi-components cards, more particularly cards with batteries, micro-controllers, displays, require an insert including interconnecting tracks engraved in the form of printed circuits. The components are then positioned and connected by welding or using conducting glue, if need be. The support has a drawback in that it is rather rigid and the method is rather expensive.

The invention aims at remedying the above-mentioned drawbacks.

The object of the invention is a method for creating a multi-component device including the following steps:
making a module having a multilayer structure comprising electrical/electronic components connected together arranged on at least one substrate in stacked layers, the components each having a main surface exposed to the outside.

The method is particular in that the components are arranged such that their respective main faces are oriented in mutually opposite directions.

The connection enables a communication or a supply and may be of various known types, i.e. either electrical or contactless (capacitor, electromagnetic or optic coupling, ...).

According to other characteristics of the method:
the components are positioned on two opposite faces of a substrate;
the components are positioned on the same face of a double-folded substrate;
the components are positioned each on different substrates assembled back-to-back afterwards;
the method includes a step of inserting the module into a body of the device, with the insertion being performed through an opening coming out onto a main face of the body of the device and leading to a recess arranged in the body such that a component of the module comes out onto or is exposed on each opposite face of the body for a direct visual or tactile interaction with a user.

Another object of the invention is the device corresponding to or obtained by the above method.

The method is advantageous with respect to the state of the art since it makes it possible to create a multifunctional device more particularly with display and/or switch and/or biometric functions by inserting only one module in one operation.

Other characteristics and advantages of the invention will emerge when reading the following description which is given as an illustrative and not restrictive example, and referring to the appended drawings, wherein.

Figure 1:
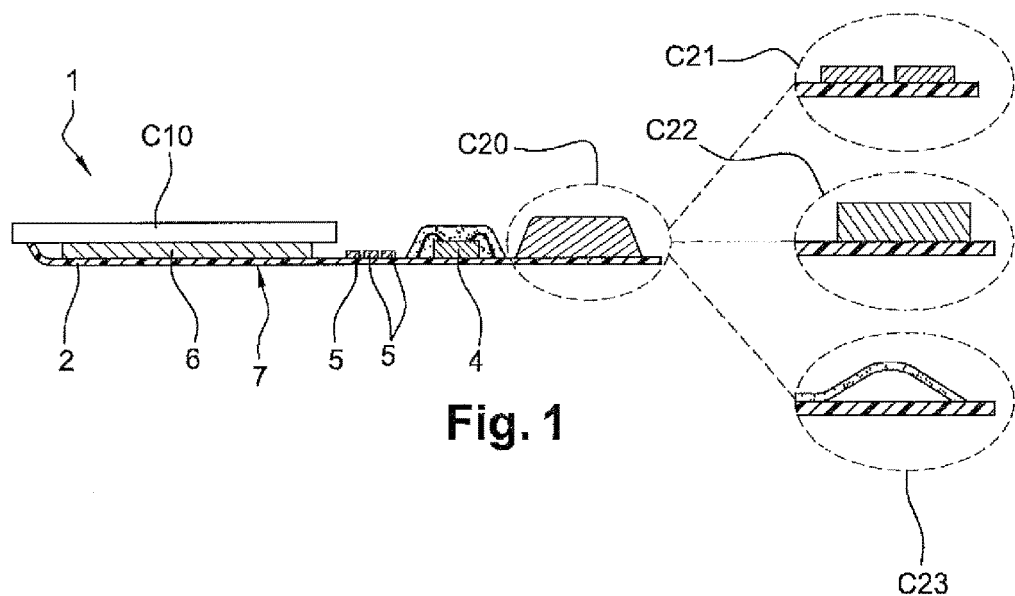
FIG. 1 illustrates a schematic view of a multifunctional device according to one embodiment of the invention.

FIG. 1 illustrates, according to one embodiment of the invention, a multifunctional or a multilayered structure module or device including electrical/electronic components positioned on a substrate in stacked layers. In the example, the module includes at least two different components on a substrate 2 and on the same side, at first. The components each have one of their main faces exposed to the outside of the module.

The substrate is preferably flexible, and/or thin, so that it can be folded without being damaged at least at an ambient temperature (23° C.). Preferably, they are interconnected by at least one interconnection track made by etching or any other interconnection means, whether a wire or something else.

The multi-component on the one hand includes a display for C10, and a fingerprint sensor C20. Alternately, such components may be replaced by any electronic or electrical component such as an interface with electric contacts or an antenna C21, a sensor C22, one or more keys C23 or other components, not shown.

The device preferably includes a microcontroller 4, here as an integrated circuit chip in order to drive at least one of the components.

The device may also include passive components 5 such as a resistance, a capacitor, etc . . . .

In the example, the components are all positioned on the same side of the substrate but they may be distributed on the two opposite sides of the substrate.

The device may also include a thin, flexible or rigid battery 6, having a small surface. Here it is positioned under the screen, between the substrate and the screen. The screen may be made using the OLED, electrophoretic, electrochromic technology or a type of technology making it possible to produce thin displays. It should be noted that, as the method provided does not necessarily use a high temperature, the range of screen technology may be wider than for a conventional hot lamination method for producing the card with the insert.

Component means here any electrical, electronic or electromechanical circuit element. A simple contact may also be considered, in some cases, as a connection electrical component.

According to one characteristic of the invention, the components are so arranged as to have their respective main faces oriented in mutually opposite directions.

Figure 2:
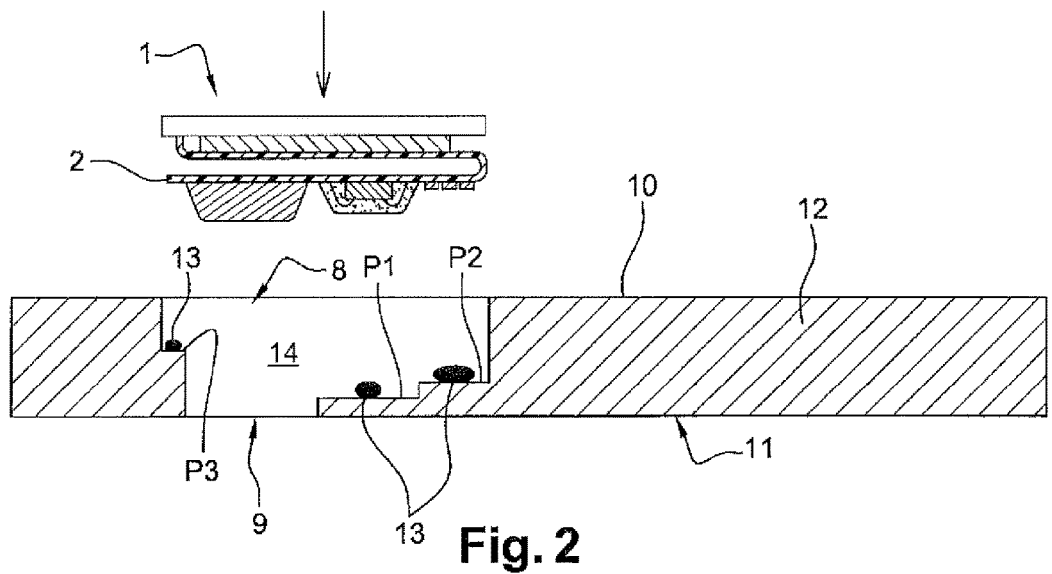
FIG. 2 illustrates an operation of insertion of the module into a chip card body.

According to an embodiment of the example, in FIG. 2, the module 1 is then double-folded. In the example, the back face is double-folded. If need be, an adhesive is positioned on the back face (opposite the front face which bears the components) in order to hold the module in folded position. The screen C10 is, for instance, a surface of 30 to 45 mm$^2$ and the component C20 corresponding to the surface of a module complying with ISO 7816 standard, substantially one third of the screen surface.

In its folded configuration, the module is more compact. Folding makes it possible to have components on the two opposite faces of the module.

The unfolded configuration makes the positioning and the connection of the various components easier.

Alternately, the components C20, 5 on the back of the substrate with respect to the main face carrying the component C10 may be fixed on the back face of the substrate 7.

Alternately again, such components may be positioned separately on a portion of the substrate which is different from the flexible substrate 2 as two different modules which are then assembled, for instance back-to-back (back face against back face). Interconnections, if any, are made by any known means, more particularly a conducting glue, an anisotropic conducting film (ACF), thermo-compression, ultrasonic welding. The modules may include tracks or connections on the two main faces or conducting vias through the substrates.

A module having a multilayer structure has thus been produced, which includes electrical/electronic components positioned on a substrate in stacked layers. 3D, currently called "3D SiP", technologies are preferably used for assembling the electronic components.

The module is then positioned in a card body similarly to the chip card technology.

The card body includes two main faces 10, 11, which are mutually opposite. It includes a first opening 8 coming out onto the face or plane 10 and a second opening 9 coming out onto the face or plane 11 leading to a common recess 14. The openings 8, 9 have different sections or ranges and respectively correspond to the surfaces of the components C10, C20, exposed on the surfaces or visible on such surfaces.

The recess 14 is so dimensioned and configured as to match the overall dimensions of the module 1, when it is folded. The opening 9 is so dimensioned and configured as to make a component C20 positioned on the back face of the module (here, under the screen) come out, when the module is accommodated in the recess.

The recess has one or more support planes P1, P2, P3 intended to wedge and glue the module. For this purpose, an adhesive 13 is distributed on the planes as drops of glue. Glue can also be a solid pressure-sensitive or heat-sensitive adhesive.

Preferably, the component C10 having the largest surface is made visible or accessible on a face of the body, whereas on the opposite face of the body, at least one component C20 having a smaller surface than that of C10, is made visible or accessible.

The module is then conventionally positioned on or inserted into the card body, like a chip card module.

Covering sheets which are transparent or have at least one opening above the components C10, 20 may complete the device, if need be. In a certain embodiment, the cavity will not be a through opening but the bottom of the cavity may be transparent. In this embodiment, the module may be positioned with the display at the bottom (in the direction of the arrow in FIG. 2), which will make it visible through the bottom of the cavity.

The device may include a radiofrequency antenna, if need be. It may be in the module and/or the card body. The connection of the antenna may be provided as for a dual card, with and without contacts. For instance, the antenna of the card body has connection end portions reaching the cavity in the body and accessible via one or more opening(s) at the surface of the card body in order to connect a microcircuit upon positioning the module in the cavity.

The chip may be able to implement at least one software application stored therein in order to execute an electronic transaction such as a banking payment, an operation of debit/credit of points, units, loyalty points, access control, authentication, etc.

The application may be implemented by the interaction with a reader or a radiofrequency terminal or another device of the same type as the invention, including a function or an electronic chip of the radiofrequency NFC (Near Field Communication) type. The device itself may be able to execute an NFC function.

The device may also be an identity document, an electronic passport or be included therein.

In the preferred application with a display, the invention is advantageous in that the module with the display is made by a simple insertion, like a chip chard module. The module may not include another component coming out onto or visible on the other face.

The invention claimed is:

1. A method for creating a multi-component device, including or forming a chip card module, with said method including the following steps:
    making a chip card module having a multilayer structure comprising electrical/electronic components connected together and arranged on at least one substrate in stacked layers, the components being mounted on respective portions of the at least one substrate which face in mutually opposite directions, and
    inserting said chip card module, including said components and said at least one substrate, into a recess of a body of the device, said device body having an opening on a main face, with the insertion being performed through said opening,
    wherein the components include a microcontroller in the form of an integrated circuit chip which drives at least one other of the components, and wherein the components are arranged so that a main surface of at least one of said components is exposed to the outside at the opening for a direct visual or tactile interaction with a user, and said at least one of said components is mounted to a surface of the at least one substrate, wherein said surface faces the opening.

2. A method according to claim 1, wherein the components are positioned on two opposite faces of the substrate.

3. A method according to claim 1, wherein the substrate is a double-folded substrate, and the components are positioned on the same face of the double-folded substrate.

4. A method according to claim 1, wherein the components are positioned each on different substrates assembled back-to-back afterwards.

5. A method according to claim 1, wherein the recess opens onto each opposite main face of the body of the device.

6. A multi-component device including or forming a chip card module with a multilayer structure comprising at least two electrical/electronic components connected together and arranged on at least one substrate in stacked layers, wherein the components include a microcontroller in the form of an integrated circuit chip which drives at least one other of the components, and wherein the components are mounted on respective portions of the at least one substrate which face in mutually opposite directions, said chip card module, including said components and said at least one substrate, being inserted into a recess of a body of the device, said device body having an opening on a main face, with the insertion being performed through said opening, wherein the components are arranged so that a main surface of at least one of said components is exposed to the outside at the opening for a direct visual or tactile interaction with a user, and said at least one of said components is mounted to a surface of the at least one substrate, wherein said surface faces the opening.

7. A device according to claim 6, wherein the components are positioned on two opposite faces of the substrate.

8. A device according to claim 6, wherein the substrate is a double-folded substrate, and the components are positioned on the same face of the double-folded substrate.

9. A device according to claim 6, wherein the components are positioned each on different substrates assembled back-to-back.

10. A device according to claim 6, wherein the recess has an opening on each opposite main face of the body of the device.

* * * * *